(12) United States Patent
Vickery et al.

(10) Patent No.: US 6,604,233 B1
(45) Date of Patent: Aug. 5, 2003

(54) METHOD FOR OPTIMIZING THE INTEGRATED CIRCUIT CHIP SIZE FOR EFFICIENT MANUFACTURING

(75) Inventors: Carl A. Vickery, Garland, TX (US);
James D. Goon, Dallas, TX (US);
Robert A. Tuerck, Garland, TX (US);
Troy M. Loveday, Allen, TX (US);
Jesse Rojas, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 186 days.

(21) Appl. No.: 09/585,069

(22) Filed: Jun. 1, 2000

Related U.S. Application Data (60) Provisional application No. 60/141,325, filed on Jun. 28, 1999.

(51) Int. Cl.[7] .............................................. G06F 17/50
(52) U.S. Cl. .............................. 716/19; 716/21; 716/14; 326/38; 326/39; 327/99; 327/202; 257/328; 364/468; 364/468.28
(58) Field of Search ............................ 716/21; 700/214

(56) References Cited

U.S. PATENT DOCUMENTS

| | | | |
|---|---|---|---|
| 5,305,222 A | 4/1994 | Nakamura | 364/468 |
| 5,699,260 A | 12/1997 | Lucas et al. | 364/468.28 |
| 6,016,391 A | * 1/2000 | Facchini et al. | 716/21 |
| 2001/0047222 A1 | * 11/2001 | Wiester et al. | 700/214 |

* cited by examiner

Primary Examiner—Matthew Smith
Assistant Examiner—Helen B Rossoshek
(74) Attorney, Agent, or Firm—Peter K. McLarty; W. James Brady, III; Frederick J. Telecky, Jr.

(57) ABSTRACT

The number of good IC (Integrated Circuit) chips per wafer or time to print a wafer is optimized by examining a number of prospective chip-to-wafer offsets, and, for each offset, a number of prospective arrangements of reticle exposures (shot maps). Integrating such a shot map optimization sub-system with a reticle layout (frame generation) sub-system permits creation of an optimal shot map for an IC chip of known size. These two sub-systems can also be used iteratively to explore a range of possible chip sizes, presenting the results in a simple graphical form. The instant invention integrates shot map optimization, frame generation and chip size optimization/visualization into a single system, providing the chip designer with insight into the impact of chip size on manufacturability.

6 Claims, 9 Drawing Sheets

| DESIGN | FIRST PREFERRED EMBODIMENT CPW | PATENT 5,305,222 CPW |
|---|---|---|
| DESIGN1 | 318 | 317 |
| DESIGN2 | 230 | 230 |
| DESIGN3 | 421 | 418 |
| DESIGN4 | 882 | 881 |
| DESIGN5 | 705 | 704 |
| DESIGN6 | 316 | 315 |
| DESIGN7 | 746 | 741 |
| DESIGN8 | 410 | 410 |
| DESIGN9 | 122 | 120 |

CPW = CHIPS PER WAFER

FIG. 9

| DESIGN | FIRST PREFERRED EMBODIMENT ITERATIONS | PATENT 5,699,260 ITERATIONS |
|---|---|---|
| DESIGN1 | 523 | 1268 |
| DESIGN2 | 372 | 982 |
| DESIGN3 | 646 | 1466 |
| DESIGN4 | 1286 | 1859 |
| DESIGN5 | 1076 | 1777 |
| DESIGN6 | 542 | 1221 |
| DESIGN7 | 1081 | 1797 |
| DESIGN8 | 642 | 1378 |
| DESIGN9 | 241 | 670 |

| CASE | CHIP X MICRONS | CHIP Y MICRONS | CHIP ARRAY | SPW | CPH | Δ CPH FROM CASE 1 |
|---|---|---|---|---|---|---|
| 1 | 4670 | 4950 | 4 x 4 | 74 | 39005 | N/A |
| 2 | 4630 | 4950 | 4 x 5 | 60 | 44777 | +14.8% |
| 3 | 4670 | 4890 | 4 x 5 | 60 | 44898 | +15.1% |
| 4 | 4645 | 4930 | 4 x 5 | 58 | 45765 | +17.3% |

SPW = SHOTS PER WAFER, CPH = CHIPS PER HOUR
Δ CPH = DELTA CPH OR THE CHANGE IN CPH

FIG. 16

| CPW | 1116 | EST CPH | 39005.8 |
| SPW | 74 | EST WPH | 34.95 |
| ROWS | 9 | COLS | 10 |
| OFFSET | | (0.00, 2525.00) μM | |
| STEP PITCH | | 19080.00 x 20200.00 μM | |

*FIG. 15*

METHOD FOR OPTIMIZING THE INTEGRATED CIRCUIT CHIP SIZE FOR EFFICIENT MANUFACTURING

CROSS-REFERENCE TO RELATED PATENT/PATENT APPLICATIONS

The following co-assigned pending patent applications are hereby incorporated by reference:

| Patent No./Serial No. | Filing Date | TI Case Number | Inventors |
|---|---|---|---|
| 08/699,291 | 08/19/96 | TI-20151 | Goon et. al. |

FIELD OF THE INVENTION

The present invention relates to optimizing the design and manufacturing of integrated circuits (also known as 'IC chips' or 'chips'). It describes a method for allowing the IC design engineer to optimize the dimensions of an IC for manufacturing. It also allows a wafer fab engineer to optimize output or throughput of optical printing systems used in manufacturing ICs.

BACKGROUND OF THE INVENTION

In the past there has been very little improvement in the area of interaction between the design, manufacturing, and packaging of the IC chips. It has been realized that inefficient IC design can reduce throughput in the manufacturing of the IC by 60% or more. It has been recognized that for some IC designs, a slightly different chip size or aspect ratio can result in significantly better manufacturing throughput. There are very few tools available to the designer of ICs to determine the IC chip size (X and Y dimensions) that optimizes manufacturability. These programs or tools are most effectively used early in the design cycle when the designer can more easily modify the IC chip size. Similarly, very few tools are available to the wafer fab engineer to optimize the use of an existing reticle when printing wafers. The existing tools have several limitations:

Representation of reticle layout is often limited or inaccurate.

Tools are often designed to meet the needs of one and only one wafer fab.

Wafer fab optimization criteria are often inflexible and cannot be adjusted to address changing engineering or business requirements.

When generating shot maps (description of how a reticle is used to print chips on a wafer), many of these tools produce significantly sub-optimal results.

Most of these tools have no knowledge of packaging/assembly constraints.

The inaccuracies above prevent the IC designer, planner or sales engineer from getting reliable estimates of chips per wafer for a given IC design.

When determining the optimal chip size, existing tools explore a range of possible chip sizes by covering the space with an evenly distributed matrix of sample points. To explore a large region of possible chip sizes using these tools, a correspondingly large number of sample points are required, utilizing excessive compute resources. This results in severe tradeoffs between the range of chip sizes explored, accuracy of the results, and compute resources/run time. In addition, the existing tools make simplifying assumptions about the frame (scribe) around the chip. A typical, though often inaccurate, simplifying assumption is that the frame x and y dimensions are constant across the entire range of possible chip sizes. Finally, the existing tools do not have the capability to automatically explore the impact of rotating the chip on the reticle and or the wafer.

In order to maximize the number of good chips printed on a wafer it is critical that the optimal position of the integrated circuit reticle (photomask) with respect to the wafer is determined. This is the chip-to-wafer offset. Existing tools determine this offset by dividing the range of possible chip-to-wafer offsets into a regularly spaced matrix of points which are then each examined. There is a major weakness with this approach.

Packing chips onto a wafer is a discrete optimization problem; there are a large number of local maxima. The common 'matrix' method offers no guarantee that a better chip-to-wafer offset does not happen to fall between two offsets that are examined.

To compensate for the weakness above, one must sweep the range of allowed chip-to-wafer offsets using very small steps. This creates a very large matrix of prospective offsets to examine. The required computation places severe limits on how broad a set of parameters can be explored. To minimize the use of compute resources, sacrifices are often made in the quality of the solution.

SUMMARY OF THE INVENTION

The instant invention is a method and system for optimizing the size of an IC chip and the number of IC chips obtainable from a wafer. The system integrates:

(a) a chip size optimization and visualization sub-system (contour plot)

(b) a frame (scribe) generation sub-system (reticle layout)

(c) a shot map optimization sub-system (wafer layout)

Integration of these three sub-systems provides an efficient and optimal solution for both:

IC designers optimizing the size of the chip

Wafer fab engineers optimizing either output or throughput on an optical printing system The chip size optimization sub-system uses a computationally efficient 'divide-and-conquer' method to explore the range of possible chip sizes. This allows a large range of possible chip sizes to be explored without excessive compute resources and run time.

The frame generation sub-system uses a method that determines the exact dimensions of the frame and the exact number and arrangement of chips on the reticle for a particular chip size, wafer fab and manufacturing process. This significantly enhances the accuracy of the chip size optimization results.

The shot map optimization sub-system can optimize the output or throughput of the wafer fab optical printing system. The wafer fab may choose to optimize output—measured in chips per wafer (CPW). Alternatively, the wafer fab may choose to optimize throughput—measured in chips per hour (CPH)—achieving a balance between the number of chips on the wafer versus the manufacturing resources required to produce them. Shot map optimization is performed in a computationally efficient manner, allowing a large number of options to be explored without excessive compute resources or run time.

These and other advantages will be apparent to those of ordinary skill in the art having reference to the specification in conjunction with the drawings.

DETAILED DESCRIPTION OF THE PREFERRED EMBODIMENTS

Figure 1:
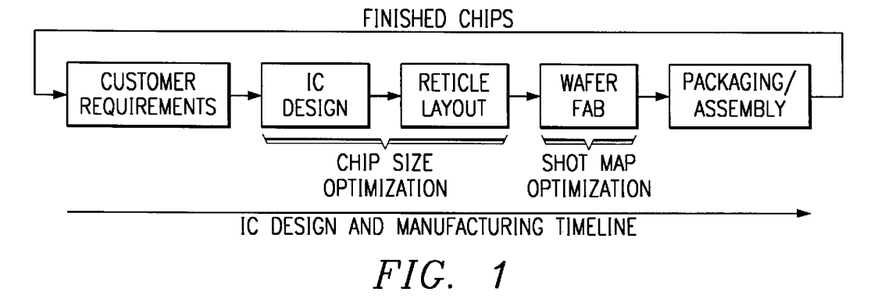
FIG. 1 illustrates the timeline for design and manufacturing of IC chips.

The creation of an IC chip consists of the following basic steps, as illustrated in FIG. 1.

Collecting customer requirements to specify the function and constraints of the chip and the system in which it will be used Design of the chip in conformance with the customer's requirements Design of the tooling (set of quartz reticles) to be used to manufacture the chip Calculation of the shot map which determines how the reticles will be used to print chips onto silicon wafers. This shot map is then used with the set of reticles to manufacture the IC chips.

Figure 2:
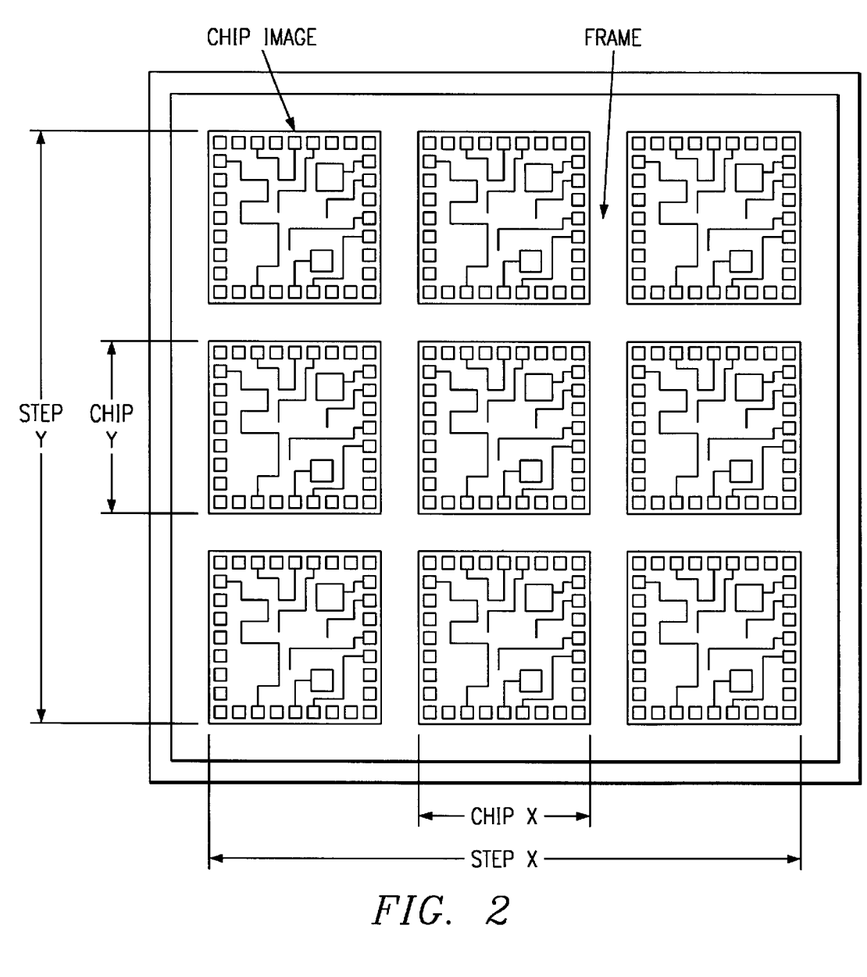
FIG. 2 illustrates a quartz reticle used to print chips on a wafer.
Figure 3:
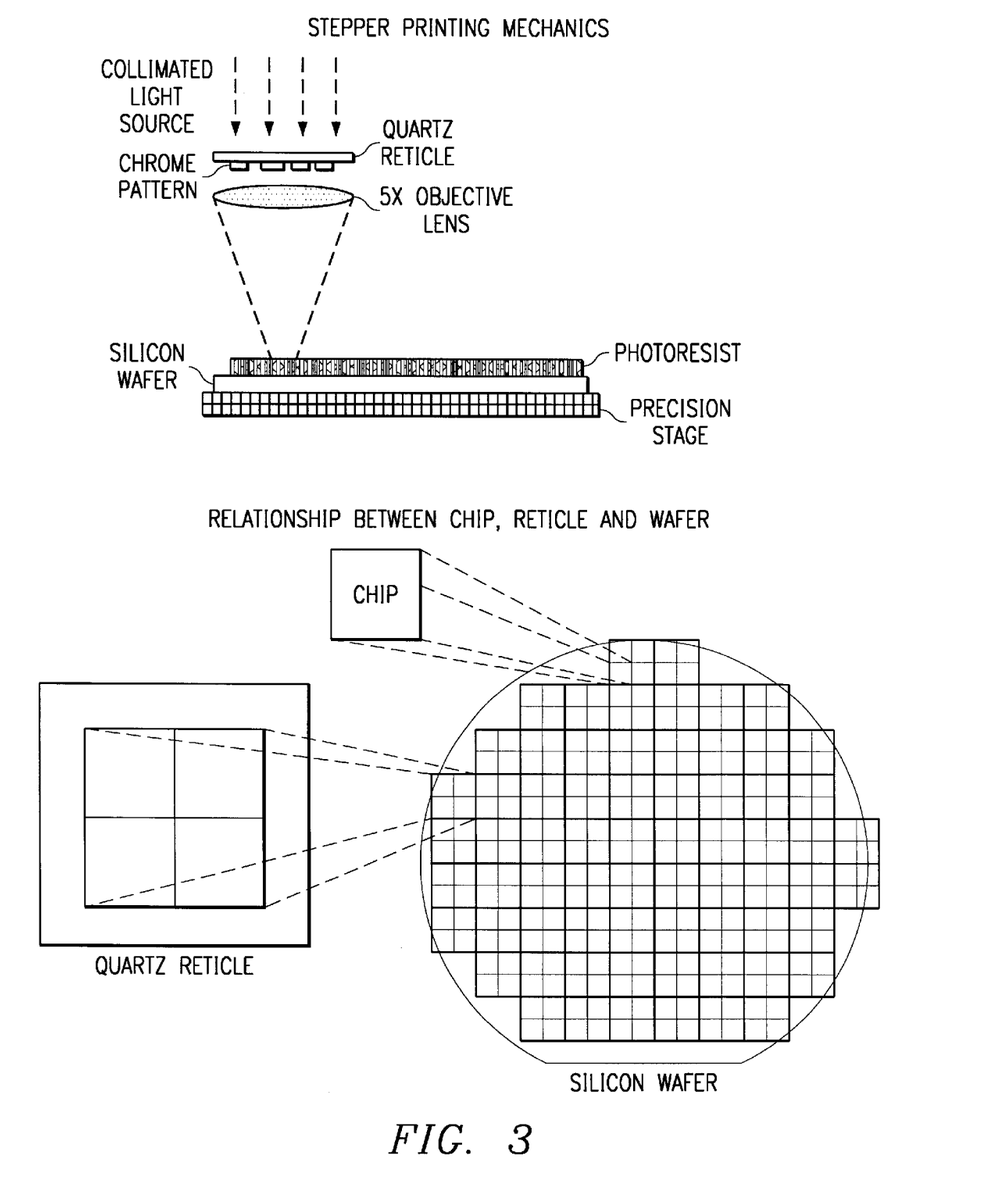
FIG. 3 illustrates the operation of an optical printing system by which a collimated light source transmits light through a quartz reticle onto a silicon wafer that is coated with a light sensitive chemical. The upper figure is a sectional view. The lower figure is a planar view.

Separation of wafers into discrete chips which are then packaged in a form that is suitable for use in the customer's system The various layers that make up the IC are patterned using a photolithographic process. A reticle that contains one or more copies of an image of an integrated circuit is used to pattern a layer on a silicon wafer. The reticle is usually made of quartz with a chrome pattern on its surface. Such a reticle is illustrated in FIG. 2. The pattern on the reticle is transferred to the wafer using an optical printing system as shown in FIG. 3. Here, energy passing through the reticle is focused through the objective lens to expose a region on the silicon wafer, thus transferring the pattern on the reticle to the silicon wafer. The objective lens serves to reduce the reticle pattern to the desired size on the silicon wafer. A high-precision stage moves the silicon wafer to the next position to be exposed. This iterative process continues until the entire wafer is patterned. Each exposure of the reticle is called a 'shot' and the arrangement of shots on the wafer is a 'shot map'. The relationship between the chip, reticle and wafer is shown in FIG. 3. Optical printing system output is related to the number of complete chips printed on the wafer. Throughput is inversely related to the number of shots required to pattern the wafer. The high cost of optical printing systems and their relatively low throughput often makes this equipment a bottleneck (factor which limits productivity) in the wafer fab.

Figure 4:
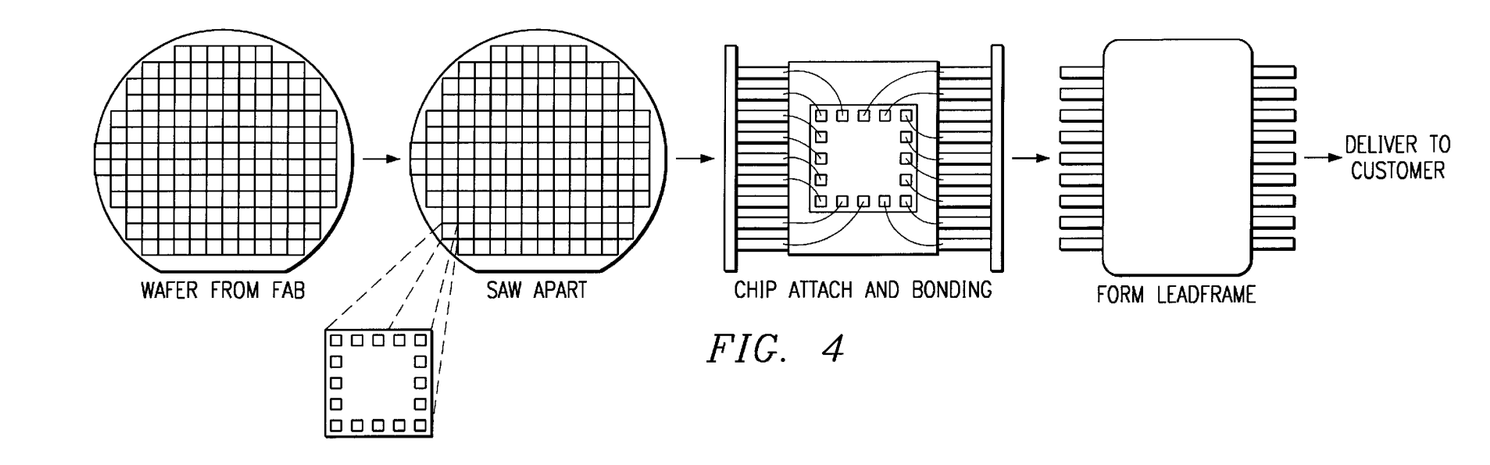
FIG. 4 illustrates the IC packaging flow in which completed chips on a wafer are separated and assembled into a package that can be used in the customer's application.

The wafer, as illustrated in FIG. 4, from the wafer fab has completed all manufacturing steps. It is then separated into individual chips. Each chip is attached to a leadframe and connected to externally accessible metal leads. Finally, the integrated circuit is hermetically sealed or encapsulated, resulting in a formed leadframe and a finished chip. The chip is now ready for use in the customer's system.

An first preferred embodiment is a system that integrates the following sub-systems:

(a) a chip size optimization and visualization sub-system (contour plot)

(b) a frame (scribe) generation sub-system (reticle layout)

(c) a shot map optimization sub-system (wafer layout)

Figure 5:
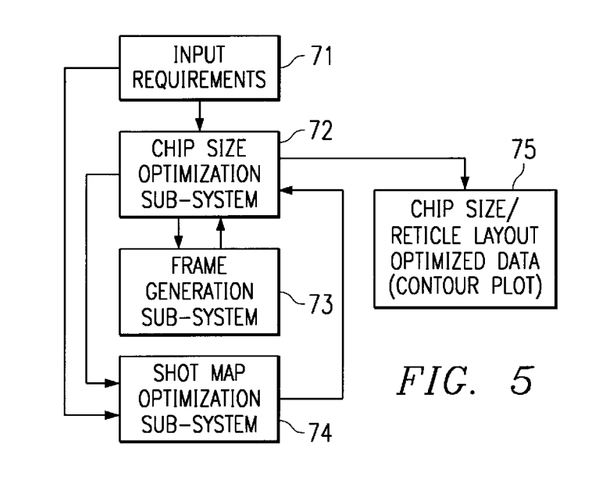
FIG. 5 illustrates a system for optimizing the size of an IC chip from the perspective of the IC designer.

This is illustrated in FIG. 5, which shows the flow of data between the various components of the system when used by an IC designer for chip size optimization. In 71 the inputs to the system are defined. This includes the range of chip sizes to be examined, the target wafer fab and process, and any other goals, constraints and requirements. This information is fed to the chip size optimization and visualization sub-system 72, which analyzes the range of chip sizes. Various potential chip sizes will be passed to the frame generation sub-system 73, with chip and reticle layout information being passed back to the chip size optimization sub-system. This reticle layout information can then be passed to the shot map optimization sub-system 74. When the specified range of chip sizes is completely analyzed, the resulting chip size contour plot is displayed 75. Selecting a chip size on the contour plot causes the corresponding optimized reticle layout, wafer shot map and statistics (wafer fab output and throughput) to be displayed.

Figure 6:
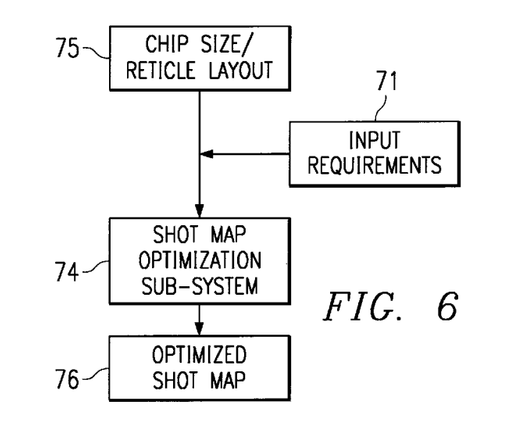
FIG. 6 illustrates a system for optimizing a shot map (description of how a reticle is used to print chips on a wafer) of an IC chip from the perspective of the wafer fab engineer.

A complementary use is illustrated in FIG. 6, which shows the flow of data between the various components of the system when used by a wafer fab engineer for shot map optimization. In 71 the inputs to the system are defined, including the wafer fab, process and other goals, constraints and requirements. In 75 the reticle dimensions of an existing reticle are included. This information is fed to the shot map optimization sub-system 74 and the results of this optimization are displayed 76. Particular embodiments of the various sub-systems and methodologies used in each will now be described.

Figure 7:
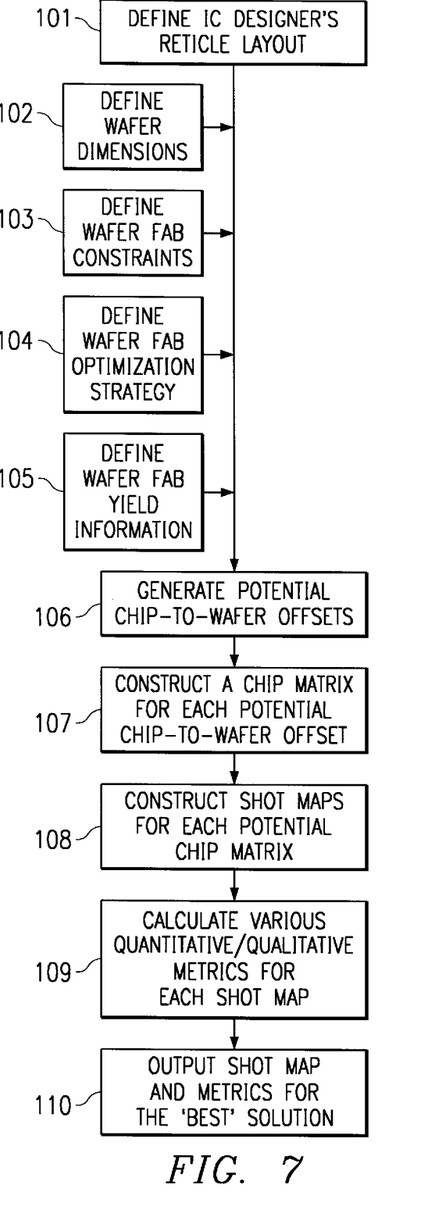
FIG. 7 illustrates a method for optimizing a wafer shot map for an embodiment of the instant invention.

An overview of a particular embodiment of the shot map optimization sub-system and the methodology used in this sub-system is shown in FIG. 7. The sub-system is described using a number of interconnected boxes showing the flow of data within the sub-system.

In 101 the reticle layout is defined. This consists of the chip size in x and y, the chip-to-chip spacing in x and y (the 'frame'), and the number of chips arrayed on the reticle in x and y. In 102, the wafer layout parameters dimensions are defined. This is comprised of the wafer diameter, the notch or flat position/size, the wafer edge exclusion size, and the notch/flat exclusion size. In 103, the wafer fab constraints are defined. Examples of wafer fab constraints include, but are not limited to, symmetrical shot layout in x or y required (yes/no), print in exclusion areas (yes/no) and print over wafer edge (yes/no). In 104, the wafer fab optimization strategy is defined. Output (measured in chips per wafer or CPW) or throughput (measured in chips per hour or CPH) may be selected. In 105 the wafer fab yield information is defined. This consists of the expected yield (percentage of chips that function within the specifications) at various locations on the wafer. This allows the shot map optimization sub-system to weight chips more likely to function as more valuable than chips less likely to function. In 106 a list of potential chip-to-wafer offsets is generated using the method in Appendix I and Appendix II. For each chip-to-wafer offset generated, a matrix of chips covering the wafer is constructed 107. In addition, the effects of edge/notch/flat exclusions and the effects of yield information are comprehended. In 108 a set of potential arrangements of reticle exposures (shot maps) to cover each matrix of chips is generated. In 109 the various quantitative/qualitative metrics for each shot map are determined (CPW, CPH, . . . ). These metrics are used to compare the various candidate shot maps. In 110, the shot map (including the chip-to-wafer offset) that best meets the wafer fab's specified optimization strategy (CPW, CPH) is output.

Figure 8A:
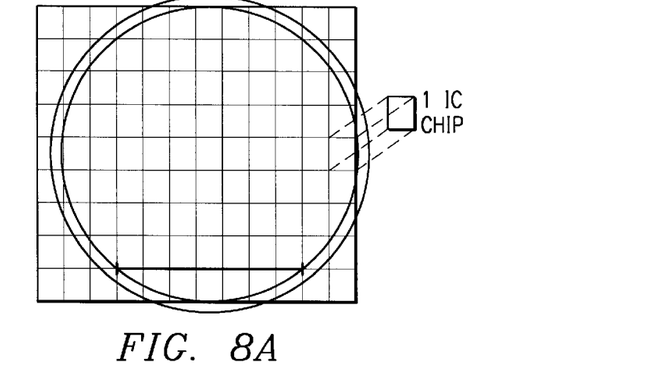
FIG. 8 illustrates a horizontal, a vertical and a diagonal chord for generating chip-to-wafer offsets in an embodiment of the instant invention.
Figure 8B:
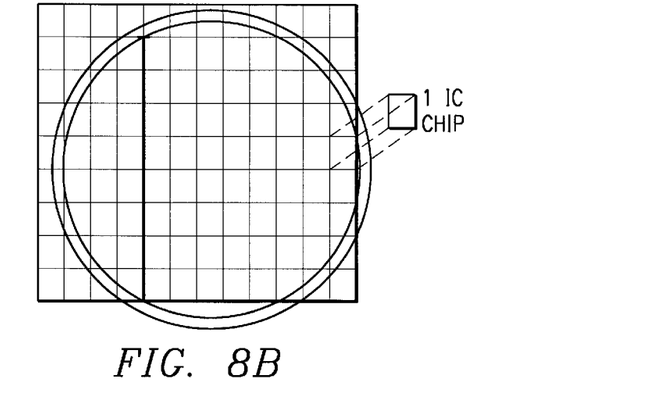
Figure 8C:
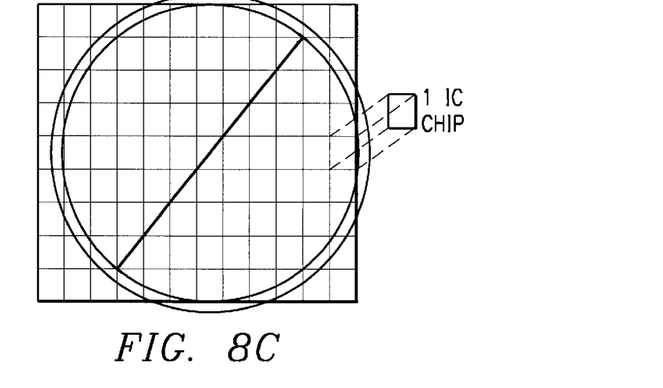

In this method (see Appendix I and Appendix II), the wafer surface is assumed to be covered with a matrix of chips spaced at regular intervals in the x and y directions. Connecting the corners of any two chips in this matrix generates a line segment. The line segment may be horizontal, vertical or diagonal. The length of a line segment must be less than the diameter of the wafer (or more often, the diameter of a circle defined by the wafer diameter minus the wafer edge exclusion distance). In this manner, every horizontal, vertical or diagonal line segment that can fit within the circle of interest is generated. For each line segment thus created, the chip matrix is then adjusted so that both end points of the line segment touch the circle of interest, forming a chord of the circle. Examples of horizontal, vertical and diagonal chords are shown in FIG. 8. The relative position of the chip matrix with respect to the wafer can then be calculated. Each chip on the wafer must be printed as part of an array of chips as defined by the reticle layout. For each chip-to-wafer offset, the preferred embodiment examines various possible arrangements of shots (reticle exposures) to cover the wafer. The shot map (arrangement of reticle exposures) which best meets design criteria for the given application is selected.

An intuitive explanation is that the preferred embodiment starts with a line segment defined by two corners in the chip matrix. One end of the line segment is attached to the edge of the circle but is free to move along the edge. The line segment is then moved horizontally and or vertically until the second point is also on the edge of the circle. This is, in effect, keeping a chip (touching the first point of the line segment) entirely within the circle while simultaneously fitting a second chip (touching the second point of the line segment) entirely within the circle. This method is independent of the size or aspect ratio of the chip and of the dimensions of the wafer. It does not require dividing the range of possible chip-to-wafer offsets into a discrete set of points. Unlike existing methods that create potential chip-to-wafer offsets in an undirected manner, this method selects offsets with the express goal of maximizing chips per wafer.

Figure 9:
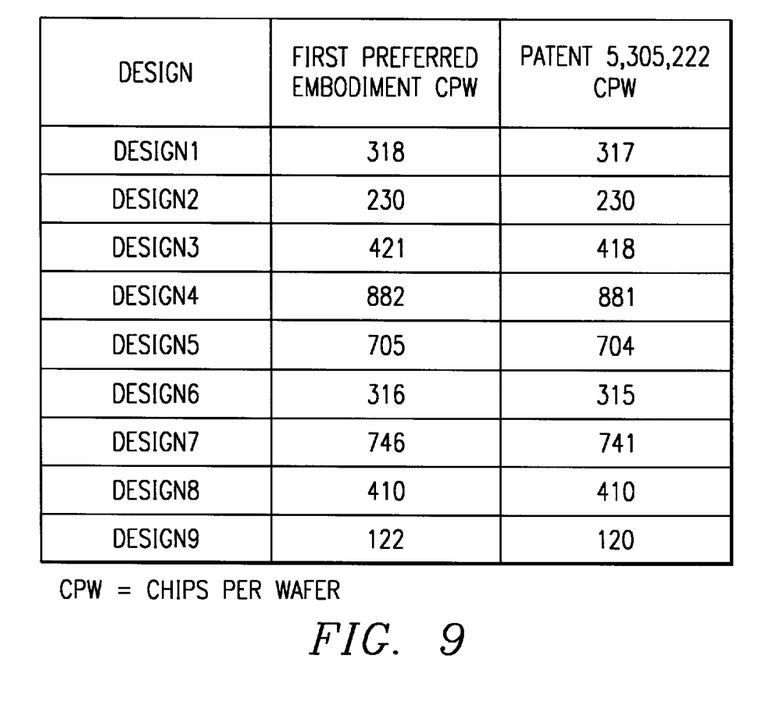
FIG. 9 compares the quality of shot map solutions obtained from an embodiment of the instant invention with that of U.S. Pat. No. 5,305,222 for a number of different IC chips.

FIG. 9 compares the results obtained from preferred embodiment with those obtained using the method described in U.S. Pat. No. 5,305,222 for a number of different designs. In this example, the goal is to maximize the number of chips per wafer (CPW). In all cases, the current method is equal or superior to the method described in the aforementioned patent.

Figure 10:
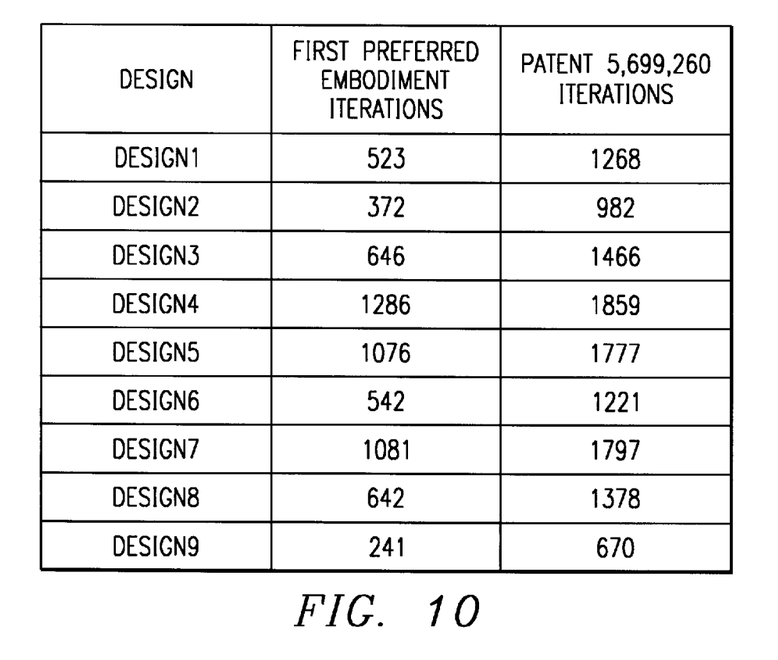
FIG. 10 compares the number of iterations to arrive at the same shot map solutions obtained from an embodiment of the instant invention with that of U.S. Pat. No. 5,699,260 for a number of different IC chips.

FIG. 10 compares the results of the preferred embodiment with those obtained using the method described in U.S. Pat. No. 5,699,260 for a number of different designs. The method described in the aforementioned patent is used to generate results equal to those of the preferred embodiment. The number of iterations (potential chip-to-wafer offsets examined) for the two methods are then compared. For each design examined, the preferred embodiment requires a smaller number of iterations and therefore reduced compute resources and run time to arrive at the same quality of shot map solution (equivalent CPW). Both examples (FIG. 9 & FIG. 10) use the same set of chip sizes and reticle layouts.

Figure 11:
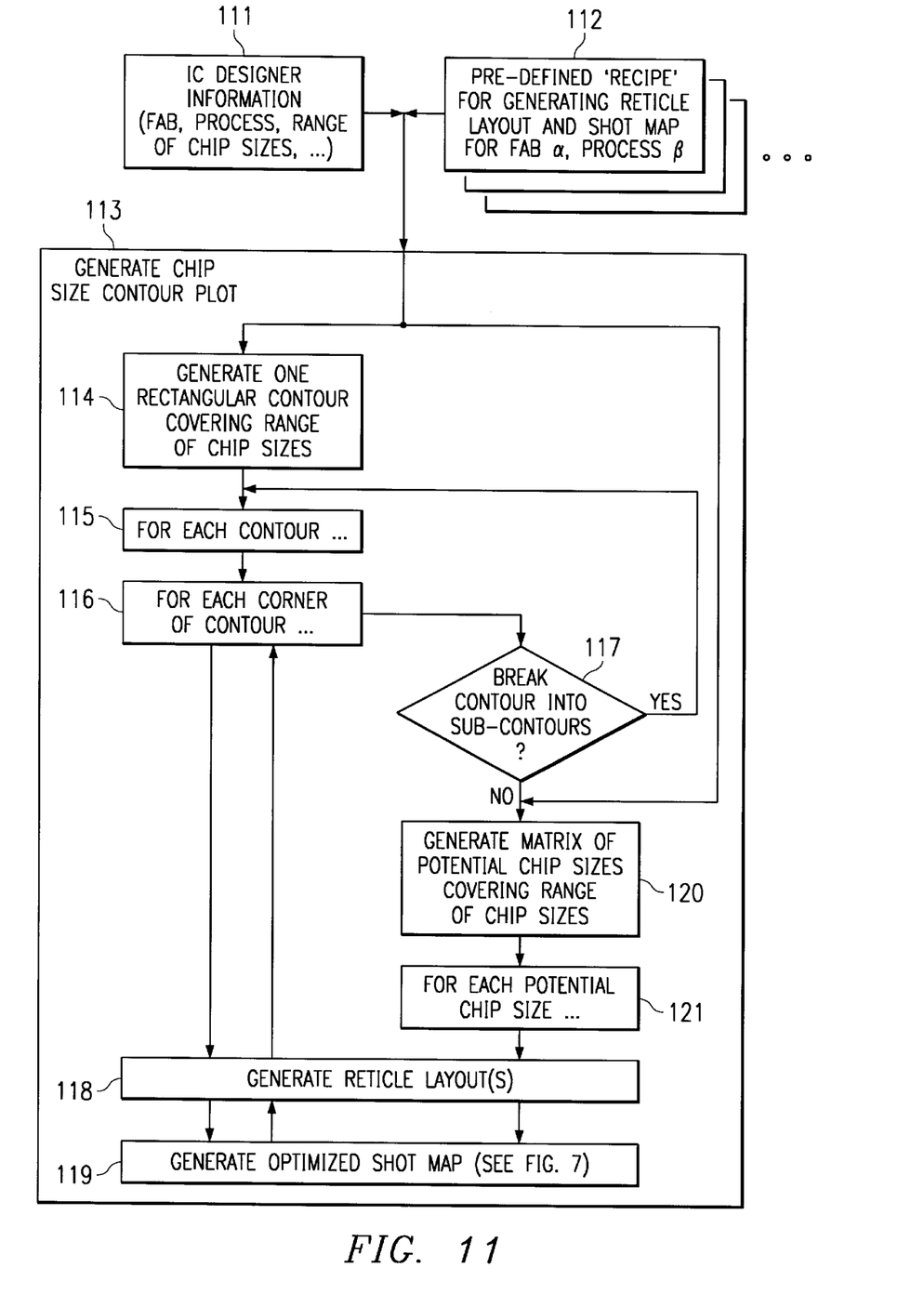
FIG. 11 illustrates a method for optimizing the size of IC chips for an embodiment of the instant invention.

An overview of a particular embodiment of the chip size optimization sub-system and the methodology used in this sub-system is shown in FIG. 11. The sub-system is described using a number of interconnected boxes showing the flow of data within the sub-system.

In 111, the information from the chip designer is collected. In general, the chip design process begins with an estimated or target chip size. The final chip size is usually not known until very late in the design flow. However, the chip designer has an awareness of the accuracy of the initial chip size estimate. For example, the estimated or nominal chip size might be specified as 4000 by 6000 microns+/−10%.

Most IC technologies (manufacturing processes) allow a chip to be printed on the wafer in either orientation (e.g. 4000×6000 or 6000×4000 microns) without affecting the function of the IC chip. It is possible that the chip size optimization sub-system can use the rotatability of a chip to advantage. If required, the designer has the freedom to force the chip to be imaged on the reticle and the wafer in its original orientation.

Chips with extreme aspect ratios (very small or very large ratios of chip x size to chip y size) can present packaging and reliability problems. Chip designers may be required to avoid chip size aspect ratios at these extremes.

Finally, the designer selects the wafer fab and the specific process within that fab that will be used to manufacture the chip.

In order to generate a reticle frame (scribe) it is necessary to satisfy the requirements of the various types of equipment used in the wafer manufacturing and chip packaging flows. Examples of such requirements include but are not limited to:

minimum chip-to-chip spacing (scribe lane dimension) for sawing wafers before packaging placement of structures for alignment of optical printing system placement of structures for measurement of lithographic, electrical and reliability parameters In order to generate a wafer shot map, additional information is required. This includes:

Wafer dimensions

Wafer fab constraints

Optimization strategy

Wafer yield information

This information is specified by the wafer fab engineers and is specific to the given wafer fab and manufacturing process (see FIG. 7).

For each wafer fab/process in 112, the collection of reticle frame requirements and wafer fab information comprises a 'recipe'. In general, there will be as many recipes as there are existing wafer fab/process permutations. In the case of $\alpha$ wafer fabs and $\beta$ processes, there may be as many as $\alpha \times \beta$ recipes.

The number of chips arrayed on the reticle is usually the most important factor affecting the throughput of an optical printing system. For example, printing 100 chips on a wafer using a reticle containing two chip images will require a minimum of 50 shots. If a reticle can be constructed that contains four images of the chip, the number of shots required to print the same 100 chips on the wafer can be reduced to as few as 25. By reducing the number of shots required from 50 to 25, the throughput of the optical printing system can almost be doubled, increasing the capacity of the wafer fab. Thus, to optimize the chip for efficient manufacturing, it is important that the designer be made aware of the impact of chip size on the number of chips that can be arrayed on the reticle.

Figure 12:
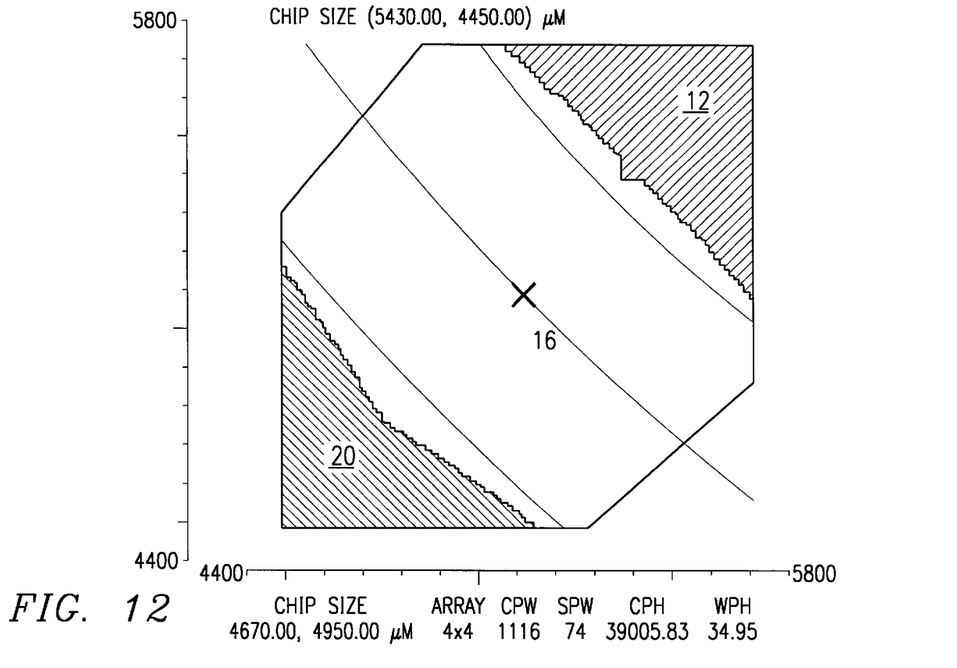
FIG. 12 illustrates a chip size contour plot created by an embodiment of the instant invention. This is the output of the chip size optimization/visualization sub-system.
Figure 13:
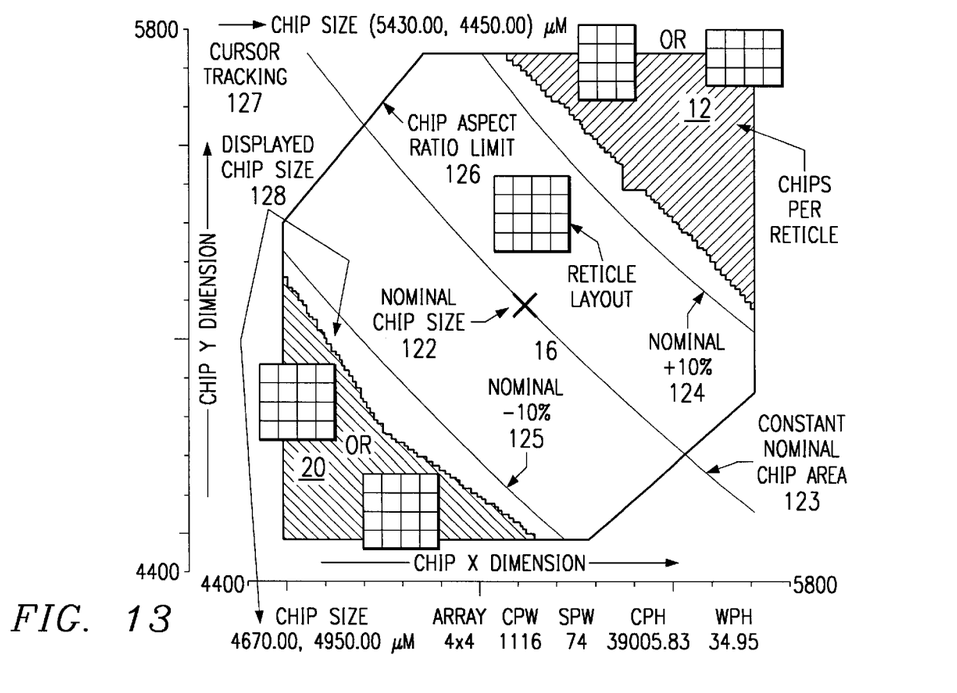
FIG. 13 is an annotated version of the contour plot in FIG. 12. It describes some of the information available to the IC designer on the contour plot.

In the instant invention, the relationship between chip size and reticle arraying (chips on the reticle) is presented in the form of a Cartesian plot in which the chip x dimension appears on the horizontal axis and the chip y dimension appears on the vertical axis. The range of potential chip sizes specified by the chip designer defines the range of x and y values appearing on the plot. This plot is composed of (often irregularly shaped) regions or 'contours' covering the range of potential chip sizes. A contour defines a region in which all chip sizes result in the same number of chips on the reticle. In FIGS. 12 and 13:

The nominal chip size, appearing in the center of the plot, is 5100×5100 microns The range of potential chip sizes extends from 4500×4500 to 5700×5700 microns (nominal chip size +/−12% or +/−600 microns)

The plot contains three contours, representing regions in which the chip sizes result in 12, 16 or 20 chip images arrayed on the reticle FIG. 11, box 113 describes the preferred embodiment process of generating a chip size contour plot. Initially, the range of potential chip sizes defines a rectangular region covering the entire contour plot 114. The corners of this rectangle define four discrete chip sizes. Using the selected wafer fab/process recipe, the number of chips on the reticle is calculated for each of the four 'corner' chip sizes 116. This calculation is performed by invoking the frame generation sub-system to generate the reticle layout 118. If chip rotation is allowed, reticle layouts are generated for both the original (e.g. 4000×6000 micron) and rotated (6000×4000 micron) chip sizes. The two reticle layouts are compared and the one containing more chips is selected. If both contain the same number of chips, optimized shot maps are generated for each 119; the reticle layout resulting in the better of the two shot maps is selected. If the chip sizes at all four corners result in the same number of chips on the reticle, it is inferred that all chip sizes within the rectangle yield the same number of chips arrayed on the reticle. The region covered by this rectangle requires no further analysis $117_{No}$.

If, however, the reticle arraying is not the same at all four corners, the rectangle is sub-divided into smaller rectangles $117_{yes}$. The smaller rectangles are analyzed in the same manner as the rectangle from which they were derived 115. This process of sub-division and analysis continues until, for each rectangle, all four corners result in the same reticle arraying. This method of recursive sub-division allows the analysis of a large region of potential chip sizes while evaluating a reasonably small number of discrete chip sizes.

In FIGS. 12 and 13 the upper left and lower right corners of the chip size range are not covered by any contours. Packaging and or reliability issues may preclude the use of chips with extreme aspect ratios. Areas of the plot in which chip x/y or chip y/x exceeds the maximum aspect ratio allowed will not be covered by any contours. The empty corners of the contour plot in FIGS. 12 and 13 indicate areas of disallowed chip sizes.

The contour plot of FIG. 13 shows some of the various aspects associated with this. The nominal chip size 122 is indicated by a point on the constant nominal chip area line 123. The lines 124 and 125 show the nominal chip area plus 10 percent and the nominal chip area less 10 percent respectively. The chip aspect ratio limit is defined by 126. The cursor tracking and displayed chip size is illustrated by 127 and 128 respectively.

In general, a chip can be printed on the reticle (or the wafer) in either orientation. It is possible to take advantage of chip rotatability when generating chip size contour plots. For example, it may be possible to array more chips on the reticle if a 4000×6000 micron chip is rotated to a 6000×4000 micron orientation. In those cases in which the 4000×6000 micron and 6000×4000 micron orientations result in the same number of chips on the reticle, one orientation may result in more chips per wafer (CPW) or higher chips per hour (CPH) than the other (FIG. 11, 119). In the preferred embodiment, the impact of chip rotatability on both the reticle and wafer is handled transparently from the chip designer's point-of-view. Contours are constructed based on the preferred orientation for each potential chip size.

Figure 14:
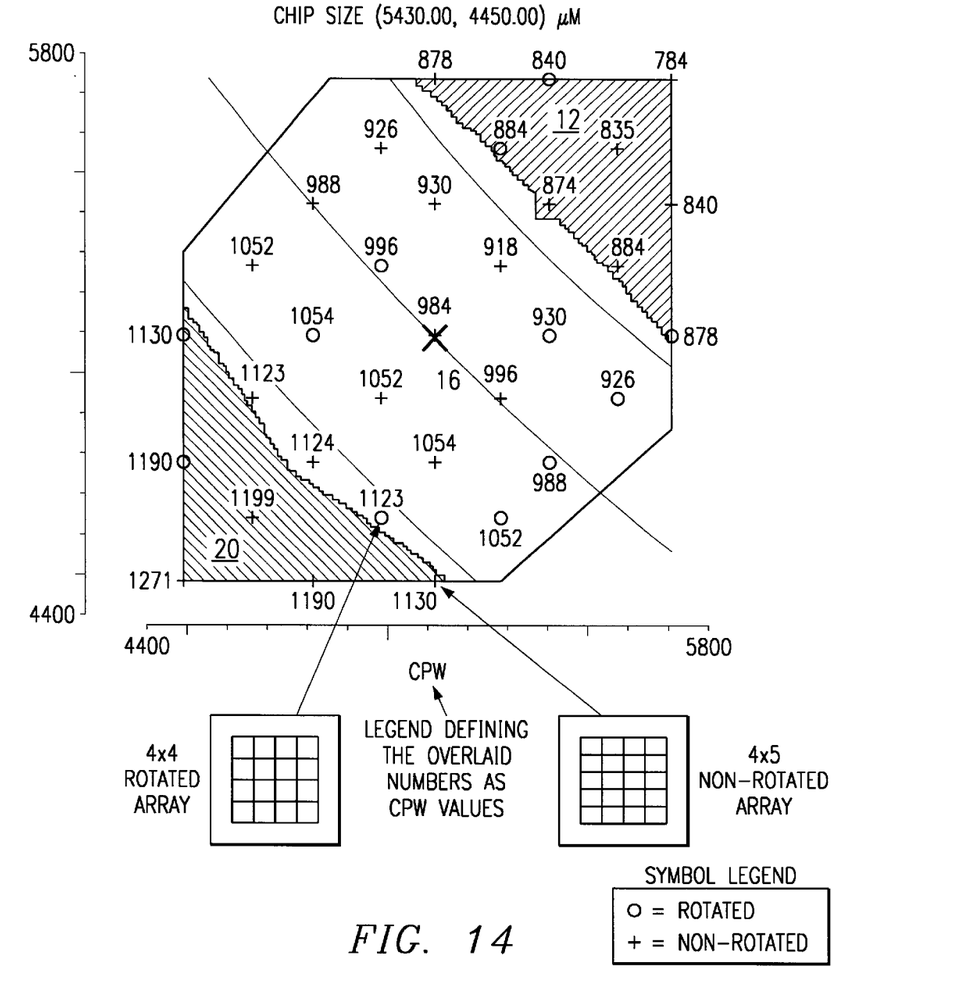
FIG. 14 illustrates a chip size contour plot overlaid with additional information. It presents a sampling of chip sizes with chips per wafer (CPW) listed for each sample chip size.
Figure 15:
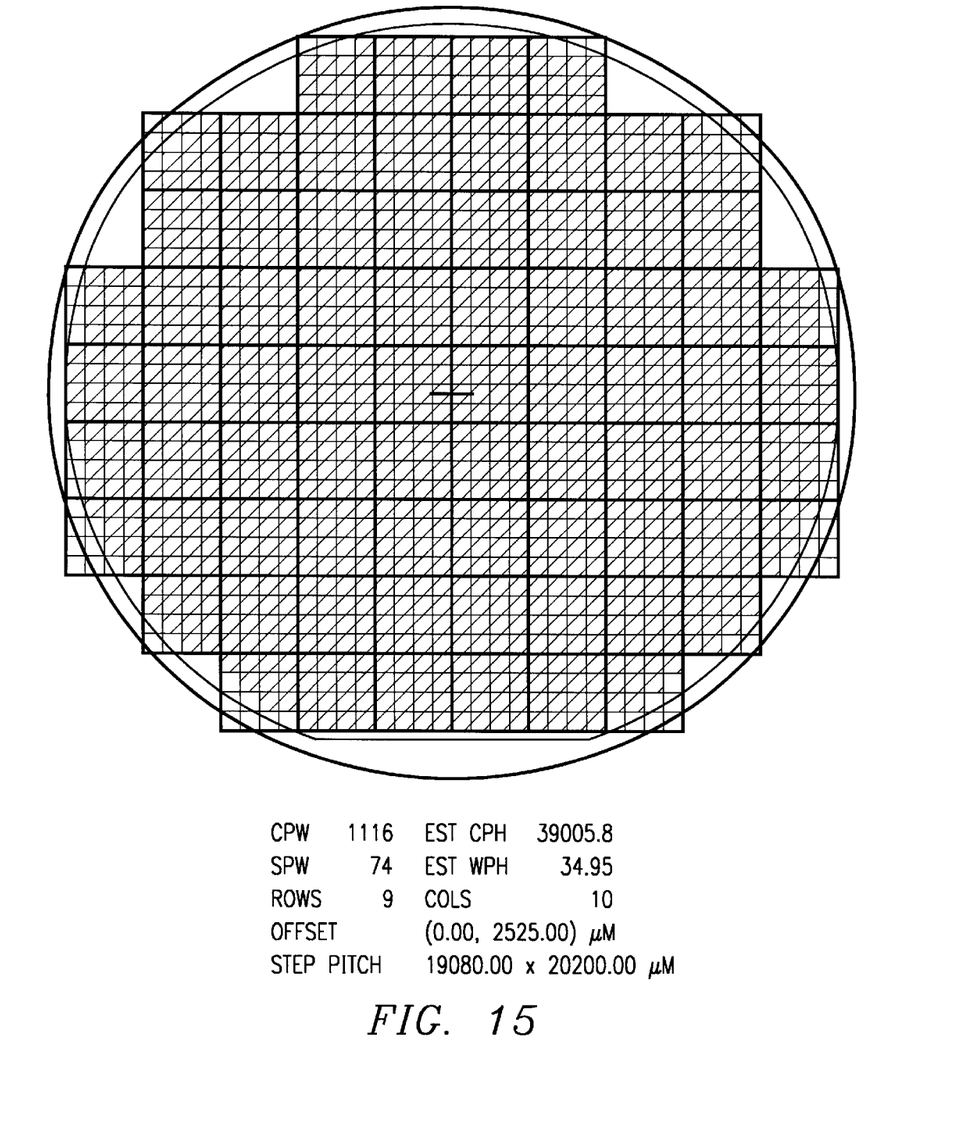
FIG. 15 illustrates a shot map for an embodiment of the instant invention. The shot map corresponds to the displayed chip size in FIGS. 12 and 13.

It is often desirable to overlay the contour plot with additional information about a sampling of chip sizes within the selected range 120 (FIG. 14). For each sample chip size 121, an optimal reticle layout is generated 118 along with an optimal wafer shot map 119. The resulting optimized shot map is shown in FIG. 15. The results for each sample chip size may include but not be limited to:

Chips per wafer (CPW)

Shots per wafer (SPW)

Chips per hour (CPH)

Preferred orientation (rotated or not) for reticle and or wafer

Reticle arraying

The information above can be presented as absolute numbers (CPW=1052) or as percentage differences (% CPW improvement=6.9%) with respect to the results from the nominal chip size (CPW=984) in FIG. 14. In an embodiment, the chip designer may interactively select any chip size on the contour plot and have similar information returned.

The instant invention provides additional information of use to the chip designer. Hyperbolas indicating chip sizes having constant area may be overlaid on the contour plot. These constant area curves can be used to indicate:

Chip area=area of nominal chip size
Chip area=nominal area +/−10%
Chip area=nominal area +/−1%
Etc.

Figure 16:
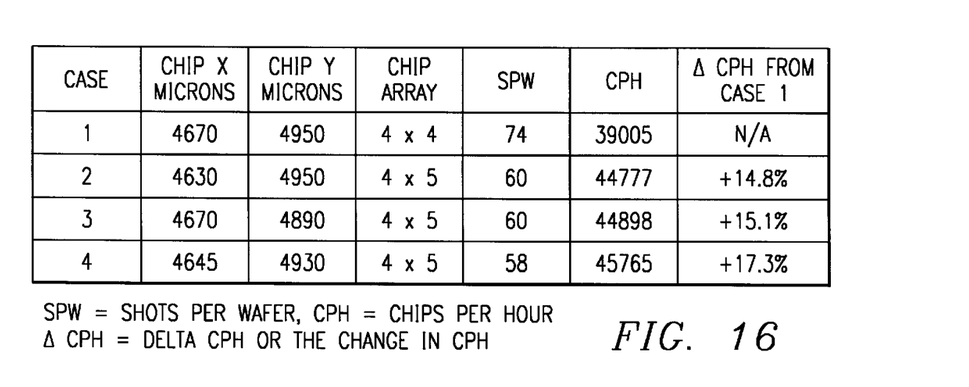
FIG. 16 compares the potential increase in manufacturing throughput that can be achieved with an embodiment of the instant invention when used by the IC designer.

For the IC designer, the preferred embodiment is primarily used to determine the optimum chip size for IC manufacturing. In FIGS. 12 and 13, the displayed chip size (4670×4950 microns) falls in the 16 chip-per-reticle contour; 74 shots are required to pattern each wafer with this 4×4 reticle array. Reducing the chip size slightly in either x or y or both can move it into the 20 chip-per-wafer contour. As shown in FIG. 16, adjusting the chip size by a small amount significantly improves manufacturing throughput (chips per hour).

Various modifications and combinations of the illustrative embodiments, as well as other embodiments of the invention will be apparent to persons skilled in the art upon reference to the description. It is intended that the appended claims encompass any such modifications or embodiments.

APPENDIX I

Simplified Method for Generating Potential Chip-To-Wafer Offsets wafer$_{13}$ radius=radius of circle formed by edge exclusion
chip_width=width (x pitch) of chip
chip_height=height (y pitch) of chip
// Determine maximum number of chips in x/y that can fit
// inside the circle
max_chips_in_x=INT (w_radius/chip_w)
max_chips_in_y=INT (w_radius/chip_h)
// Generate the complete set of horizontal/vertical/
// diagonal segments that are an integer number of
// chips wide/high.
for i=0; i<=max_chips_in_x; i++
  {
  for j=0; j<=max_chips_in_y; j++
    {
    distance_x=i*chip_width
    distance_y=j*chip_height
    // Assume that the endpoints of each segment must
    // fall on the circle. Find the x,y values that
    // meet this criteria (this is little more than
    // solving a quadratic).
    evaluate chips/shots at this offset
    }
  }

An intuitive explanation is that the algorithm puts the corner of one chip somewhere on the circle formed by the wafer radius. It then attempts to fit the corner of another chip onto the wafer radius.

APPENDIX II

Method for Finding the Chords of a Wafer

Given
  the radius of a circle (centered at 0,0) x and y distances (dx and dy)
Determine
  Two points on the circle separated by dx and dy
Equation for a circle is $$x^2+y^2=r^2$$

Assume 2 pts on the circle spaced dx, dy apart $$X^2=y^2 r^2=(x+dx)^2+(y+dy)^2$$

$$X^2=y^2=x^2+2*dx*x+dx^2+y^2+2*dy*y+dy^2$$

$$0=2*dx*x+dx^2+2*dy*y+dy^2$$

$$2*dy*y=-2*dx*x-dx^2-dy^2$$

$$y=(-dx/dy)*x-(dx^2+dy^2)/(2*dy)$$

or $$y=A*x+B$$

where A=−dx/dy, and B=−(dx$^2$+dy$^2$)/(2*dy) substitute back into equation for circle $$x^2+(A*x+B)2=r^2$$

$$x^2+A^{2*}x^2+2*A*B*x+B^2=r^2$$

$$(1+A^2)*x^2+(2*A*B)*x+(B^2-r^2)=0$$

This is a quadratic of the form a*x$^2$+b*x+c=0 where $$A=-dx/dy$$

$$B=-(dx^2+dy^2)/(2*dy)$$

$$a=1+A^2$$

$$b=2*A*B$$

$$c=B^2-r^2$$

find roots of the quadratic
  if (b<0.0)

$$q=-0.5*(b-sqrt(b^2-4*a*c))$$

else $$q=-0.5*(b+sqrt(b^2-4*a*c))$$

roots are $$x1=q/a$$

$$x2=c/q$$

We claim:
1. A method for determining an optimum shot map in a photolithographic process for a wafer surface, said method comprising the steps of:
  defining a set of input parameters;
  defining a circle with a diameter on said wafer surface;
  constructing a chip matrix comprising a plurality of chips, each of said plurality of chips having a plurality of corners, and whereby said plurality of chips are arranged in a regular pattern in a x-y Cartesian coordinate plane;
  generating a plurality of line segments formed by connecting said corners of any two chips in said plurality of chips such that each of said plurality of line segments has a length that is less than said diameter of said circle;
  defining a plurality of chip-to-wafer offsets of said chip matrix and said wafer surface whereby each of said chip-to-wafer offsets is defined by a chord formed by one of said plurality of line segments and said circle;
  determining a plurality of shot maps from said chip-to-wafer offsets and said set of input parameters; and determining an optimum shot map from said set of input parameters and said plurality of shot maps.

2. The method of claim 1 wherein said defining said set of input parameters further comprises:

defining a reticle layout;
defining a wafer layout;
defining a list of wafer fab constraints;
defining a wafer fab optimization strategy;
defining a list of wafer fab yield criteria; and
defining a design criteria.

3. The method of claim 1 wherein said determining said shot map from said set of input parameters and said list of chip matrices further comprises;

determining a IC chip yield for each of said plurality of shot maps;
determining said number of IC chips per wafer for each of said plurality of shot maps;
determining said number of shots per wafer for each of said plurality of shot maps; and
determining said optimum shot map from said IC chip yield, said number of IC chips per wafer, said number of shots per wafer, and a design criteria.

4. A method for determining an optimum chip size for integrated circuit manufacturing, said method comprising the steps of:

defining a set of designer parameters;
defining a set of reticle layout processes for a wafer fab;
defining a set of shot map processes for said wafer fab;
generating means for forming a chip size contour plot; and
determining said optimum chip size from said contour plot and said set of designer parameters.

5. The method of claim 4 wherein said defining said set of designer parameters further comprises:

defining a nominal chip size;
defining an upper bound chip size;
defining a lower bound chip size;
defining a minimum chip-to-chip spacing for sawing wafers before packaging;
defining a placement of structures for alignment of a optical printing system;
defining a placement of structures for measurement of lithographic, electrical and reliability parameters;
defining a wafer dimension;
defining a set of wafer fab constraints;
defining an optimization strategy; and
defining a list of wafer fab yield criteria.

6. The method of claim 5, wherein said generating means for forming a chip size contour plot further comprises;

a) defining a first rectangle using said nominal chip size, said upper bound chip size, and said lower bound chip size, said first rectangle having four corners;
b) generating means for determining a number of chips on a reticle for each corner of said first rectangular;
c) comparing means for determining if said number of chips on a reticle is the same for each corner of said first rectangle;
d) dividing means for forming a second rectangle by sub-dividing said first rectangle if said number of chips on a reticle is not the same for each corner of said first rectangle; and
e) optimizing means for repeating steps a), b), c) and d) until said number of chips on a reticle is the same for each corner of a final rectangle; and
f) generating a Cartesian plot comprising a chip x dimension forms a horizontal axis, a chip y dimension forms a vertical axis, and a plurality of contour each of which define a region with the same number of chips on a reticle.

* * * * *